United States Patent [19]
Bak-Boychuk et al.

[11] Patent Number: 6,099,966
[45] Date of Patent: Aug. 8, 2000

[54] DEPOSITION TARGET MEDIUM FOR DIAMOND FILM DEPOSITION

[75] Inventors: Gregory Bak-Boychuk, San Juan Capistrano; Martin G. Bradley, Irvine; Darryl K. Mack, Fountain Valley; Stephen M. Jaffe, Lake Forest, all of Calif.; Matthew Simpson, Sudbury, Mass.

[73] Assignees: Celestech, Inc., Irvine, Calif.; Saint-Gobain/Norton Industrial Ceramics Corporation, Worcester, Mass.

[21] Appl. No.: 09/190,535

[22] Filed: Nov. 12, 1998

Related U.S. Application Data

[60] Division of application No. 08/798,839, Feb. 12, 1997, Pat. No. 5,863,605, which is a continuation-in-part of application No. 08/618,428, Mar. 18, 1996, abandoned.

[51] Int. Cl.[7] ........................................... B32B 9/00
[52] U.S. Cl. ........................... 428/408; 428/702; 428/323
[58] Field of Search ...................... 428/408, 702, 428/323; 427/249.8, 249.12

[56] References Cited

U.S. PATENT DOCUMENTS

| | | | |
|---|---|---|---|
| 4,471,003 | 9/1984 | Cann | 427/34 |
| 4,487,162 | 12/1984 | Cann | 118/723 |
| 4,925,701 | 5/1990 | Jansen et al. | 427/38 |
| 4,987,002 | 1/1991 | Sakamoto et al. | 427/34 |
| 5,180,571 | 1/1993 | Hosoya et al. | 423/446 |
| 5,204,144 | 4/1993 | Cann et al. | 427/569 |
| 5,204,210 | 4/1993 | Jansen et al. | 430/198 |
| 5,270,077 | 12/1993 | Knemeyer et al. | 427/249 |
| 5,298,286 | 3/1994 | Yang et al. | 427/249 |
| 5,330,802 | 7/1994 | Yamazaki | 427/577 |
| 5,342,660 | 8/1994 | Cann et al. | 427/577 |
| 5,435,849 | 7/1995 | Cann et al. | 118/723 |
| 5,474,808 | 12/1995 | Aslam | 427/249 |
| 5,487,787 | 1/1996 | Cann et al. | 118/723 |
| 5,654,044 | 8/1997 | Moran et al. | 427/577 |

FOREIGN PATENT DOCUMENTS

0467043A2  1/1992  European Pat. Off. .

OTHER PUBLICATIONS

R. Iler, "The Colloid Chemistry of Silica and Silicates", Cornell University Press, 1955, pp. 210–215., No Month Available.

R. Iler, "Inorganic Colloids for Forming Ultrastructures", from Science of Ceramic Chemical Processing, John Wiley & Sons, 1985, pp. 3–20, No Month Available.

Morrish et al. "Effects of Surface Pretreatments on Nucleation and Growth of Diamond Films on a Variety of Substrates", Appl. Phys. Lett. 59/ (4), Jul. 22, 1991, pp. 417–419., No Month Available.

Patschider et al. Thin solid Films 253 pp. 114–118, 1994., No Month Available.

*Primary Examiner*—Roy V. King
*Attorney, Agent, or Firm*—Martin M. Novack

[57] ABSTRACT

A deposition target medium is disclosed for use in CVD of a diamond film wherein a hydrocarbon gas and atomic hydrogen are utilized in depositing the diamond film on the deposition target medium, which comprises a substrate having a Young's modulus of less than 50 GPa; and a coating on said substrate, said coating comprising a binder and diamond grit, said binder comprising a glass-forming oxide.

16 Claims, 2 Drawing Sheets

DEPOSITION TARGET MEDIUM FOR DIAMOND FILM DEPOSITION

This is a divisional of U.S. application Ser. No. 08/798,839 filed Feb. 12, 1997, now U.S. Pat. No. 5,863,605 which is, in turn, a continuation-in-part of U.S. application Ser. No. 08/618,428, filed Mar. 18, 1996 (now abandoned). The said application Ser. No. 08/798,839 is hereby incorporated by reference.

FIELD OF THE INVENTION

This invention relates to synthesis of diamond and, more particularly, to an improved method for producing diamond film by chemical vapor deposition, and to an improved deposition target medium.

BACKGROUND OF THE INVENTION

Diamond has many extraordinary properties, including superlative hardness, thermal conductivity, and optical transmissivity. Synthetic diamond produced by chemical vapor deposition ("CVD") has become commercially viable for practical applications such as wear parts, heat sinks, and optical windows. However, while the cost of producing CVD diamond has decreased in recent years, it is still quite expensive.

The production of diamond film in a chemical vapor deposition process, such as a plasma jet CVD process, involves consideration of many practical, as well as technical, factors. In order to obtain the relatively high yield that is necessary for cost effectiveness, the process is carried out at high temperatures. The large heat fluxes at the deposition region during and after deposition cause stresses in the diamond that can result in cracking of the diamond film and/or lifting of the film from the deposition target medium before deposition is complete. When attempting to deposit relatively thick films (for purposes hereof, at least 100 microns thick, and, for many applications, greater than 500 microns thick) the problems of film cracking and/or premature lifting (also called delamination) can be particularly vexing, and can reduce production yields and prevent cost effective operation. So-called "repeatability" is also a problem; that is, the ability to obtain consistent results from ostensibly the same operating conditions that proved successful on one or more occasions.

It has been recognized that a source of stress that can crack and/or prematurely delaminate a diamond film is a mismatch between the coefficients of thermal expansion of the diamond and the target medium upon which it is being deposited. To address this problem, deposition substrate materials having coefficients of thermal expansion relatively close to that of diamond can be selected. However, in selecting a substrate material, other properties must also be taken into consideration. For example, the material must be able to maintain its integrity in difficult environmental conditions of deposition, which include a high temperature and the presence of reactive substances, such as the atomic hydrogen that is essential for the diamond deposition process. As an example, graphite is attractive as a substrate material because its coefficient of thermal expansion is generally close to that of diamond. However, atomic hydrogen attacks graphite. One solution in the prior art has been to coat the graphite with a thin coating of a material such as molybdenum or tungsten, or carbon-containing compounds such as silicon carbide. These approaches have met with only limited success in improving the yield of relatively thick intact diamond films. The powders of a wide variety of substances (for example, fine powders of SiC, Si, Mo, W, $Al_2O_3$, Ti, Ta, $TiO_2$, h-BN, c-BN, $SiO_2$, $B_4C$, AlN, $Si_3N_4$, WC, MoC, or $MoS_2$, taken alone or in combination) have been proposed as coatings for many different substrate materials, and have apparently exhibited some success, at least when producing relatively thin diamond films. [Reference can be made to U.S. Pat. No. 5,180,571.] However, there is still much room for improvement, particularly with regard to yield and repeatability when making thick films.

It is among the objects of the present invention to devise a technique and a deposition target medium that improve the production of synthetic diamond film by facilitating intact growth of relatively thick diamond films by CVD methods, especially high heat flux CVD, such as CVD plasma jet deposition, and, to a lesser extent, by also facilitating release of the fabricated intact diamond film after deposition.

SUMMARY OF THE INVENTION

The present invention is directed to improvements in producing diamond film, especially relatively thick diamond film, by CVD method, with improved yield of intact diamond film, by virtue of reducing the probability of film cracking and/or delamination.

In accordance with an embodiment of the method of the invention, there is disclosed a technique for producing diamond film, comprising the following steps: providing a substrate having a Young's modulus of less than 50 GPa; providing a coating material comprising a binder and diamond grit; applying the coating material to the substrate; and depositing diamond film on the coating by chemical vapor deposition.

The substrate is selected to be a material that is relatively elastic, and, as indicated, preferably has a Young's modulus that is less than 50 gigaPascals (GPa). A relatively elastic material will help avoid stress build-up and reduce the probability that the ultimately deposited diamond film will prematurely delaminate and/or crack during the deposition process as a result of mismatch of coefficients of thermal expansion and thermal variations in time and space. Suitable materials are graphite and hexagonal boron nitride. Graphite, which is presently preferred, also matches reasonably well with diamond from the standpoint of coefficient of thermal expansion, and has sufficient thermal conductivity.

In an embodiment of the invention, the binder comprises a glass-forming oxide, preferably silicon dioxide. Other glass forming oxides are aluminum oxide, phosphorus oxide and boron oxide. In the most preferred embodiment, the glass forming oxide portion of the coating includes both silicon dioxide and aluminum oxide. Preferably, at least 10 percent by weight of the coating is diamond grit, and at least 10 percent by weight of the coating is glass-forming oxide. In these embodiments, the diamond grit has an average particle size in the range 0.1 to 10 microns and, more preferably, in the range 1 to 5 microns. Also in this embodiment, the ratio of binder to grit in the coating is preferably in the range 1:2 to 2:1, by weight, and the thickness of the coating is preferably in the range 10 microns to 200 microns and, more preferably, in the range 20 to 100 microns. [Ratios by weight, as used herein, refer to solid constituent only.]

In accordance with a form of the invention, there is also disclosed a deposition target medium for use in fabrication of diamond film by chemical vapor deposition technique. In a disclosed embodiment, there is set forth a deposition target medium comprising: a substrate having a Young's modulus of less than 50 GPa, and a coating on the substrate, the coating comprising a binder and diamond grit.

Applicant has found that a coating material formed by diamond grit mixed with a colloid of glass-forming oxide in water, can be advantageously applied to a substrate, preferably graphite. After drying, the coating of glass-forming oxide and diamond grit [in which relatively smaller grains of glass-forming oxide, preferably including both silicon dioxide and aluminum oxide, hold the relatively larger grains of diamond grit] provides a number of advantageous properties.

The system of substrate and coating that constitutes the deposition target medium hereof addresses several factors that contribute to improved diamond film deposition with reduced premature delamination and/or cracking. The substrate material matches reasonably well with diamond from the standpoint of coefficient of thermal expansion, and provides a relatively high elasticity. These properties both help to reduce the build-up of stress in the diamond film being deposited. Stresses are also reduced by providing a relatively thick substrate which provides improved thermal conduction and diminished radial temperature gradients. The coating adheres well to both the substrate and the diamond film, and its diamond content further promotes diamond nucleation. The thickness of the coating is sufficient to cover and protect the substrate, and to fill its pores and imperfections, but not so thick as to develop cracks that have been observed to increase in number and depth if the coating is made too thick. An increase in the number and depth of cracks in the coating has been found to result in an increase in the probability of premature delamination and/or cracking of the deposited diamond film, so it is important to minimize cracks in the coating.

The coating hereof is sufficiently strong, adherent, and compliant to resist premature delamination, and yet weak enough to generally permit removal of the deposited film without undue effort. As a result of all of the above, higher yield and greater repeatability are achieved, with attendant cost efficiency.

Further features and advantages of the invention will become more readily apparent from the following detailed description when taken in conjunction with the accompanying drawings.

DETAILED DESCRIPTION

Figure 1:
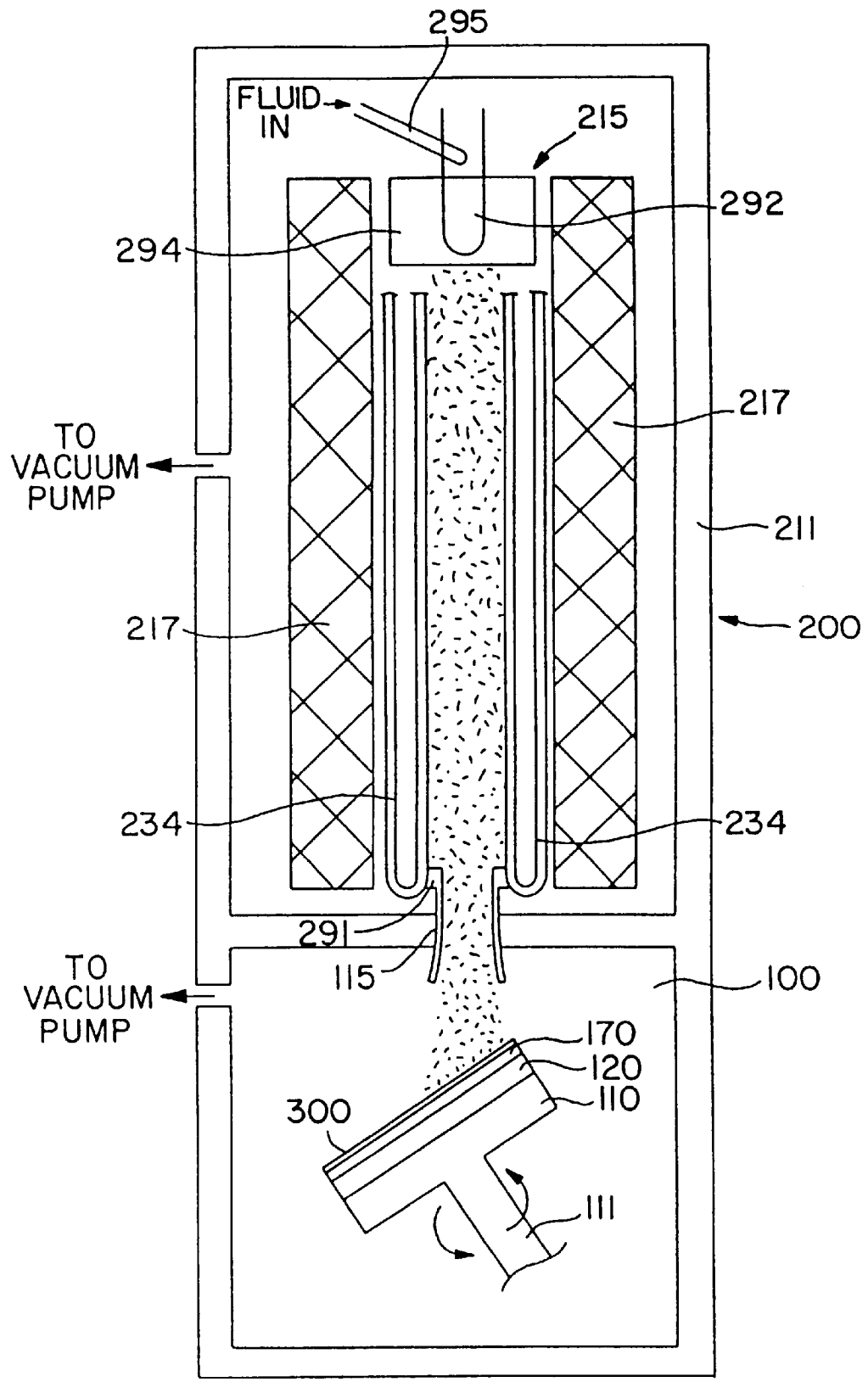
FIG. 1 is a schematic diagram of an apparatus which can be utilized in practicing embodiments of the invention.

Referring to FIG. 1, there is shown a chemical vapor deposition ("CVD") apparatus of a type which can be utilized in practicing embodiments of the invention. A deposition chamber 100 is the lower section of a plasma jet CVD deposition system 200, evacuated by one or more vacuum pumping systems (not shown).

The system 200 is contained within a vacuum housing 211 and includes an arc-forming section 215 which comprises a cylindrical holder 294, a rod-like cathode 292, and an injector 295 mounted adjacent to the cathode so as to permit injected fluid to pass over the cathode. A cylindrical anode is provided at 291. In the illustrated system, where synthetic diamond is to be deposited, the input fluid may be, for example, a mixture of hydrogen and methane. The methane could alternatively be fed in downstream. The anode 291 and cathode 292 are energized by a source of electrical power (not shown), for example a DC potential. Cylindrical magnets, designated by reference numeral 217, are utilized to help control the plasma generation. A nozzle, represented at 115, can be used to control beam size, within limitations. Optional cooling coils 234, in which a coolant can be circulated, can be located within the magnets.

In an example of operation, a mixture of hydrogen and methane is fed into the injector 295, and a plasma is obtained in front of the arc forming section and accelerated and focused toward the deposition region at which a substrate is located. As is known in the art, synthetic polycrystalline diamond can be formed from the described plasma, as the carbon in the methane is selectively deposited as diamond, and the graphite which forms is dissipated by combination with the atomic hydrogen that is obtained from dissociation of the hydrogen gas. For further description of plasma jet deposition systems, reference can be made to U.S. Pat. Nos. 4,471,003, 4,487,162, 5,204,144, 5,342,660, 5,435,849, and 5,487,787.

A mandrel 110 is rotatable on a shaft 111, and can have a spacer 120 and a substrate 170 mounted thereon by means not shown (bolting or clamping being typical), as described, for example, in copending U.S. patent application Ser. No. 08/332,832, assigned to an assignee hereof. The mandrel 110 can be cooled by any suitable means, for example by using a heat exchange fluid (e.g. water) that is circulated through the mandrel, as also disclosed in the referenced U.S. patent application Ser. No. 08/332,832. As illustrated, the mandrel can be tilted with respect to the direction of the plasma jet, as is disclosed in U.S. Pat. No. 5,342,660.

Figure 2:
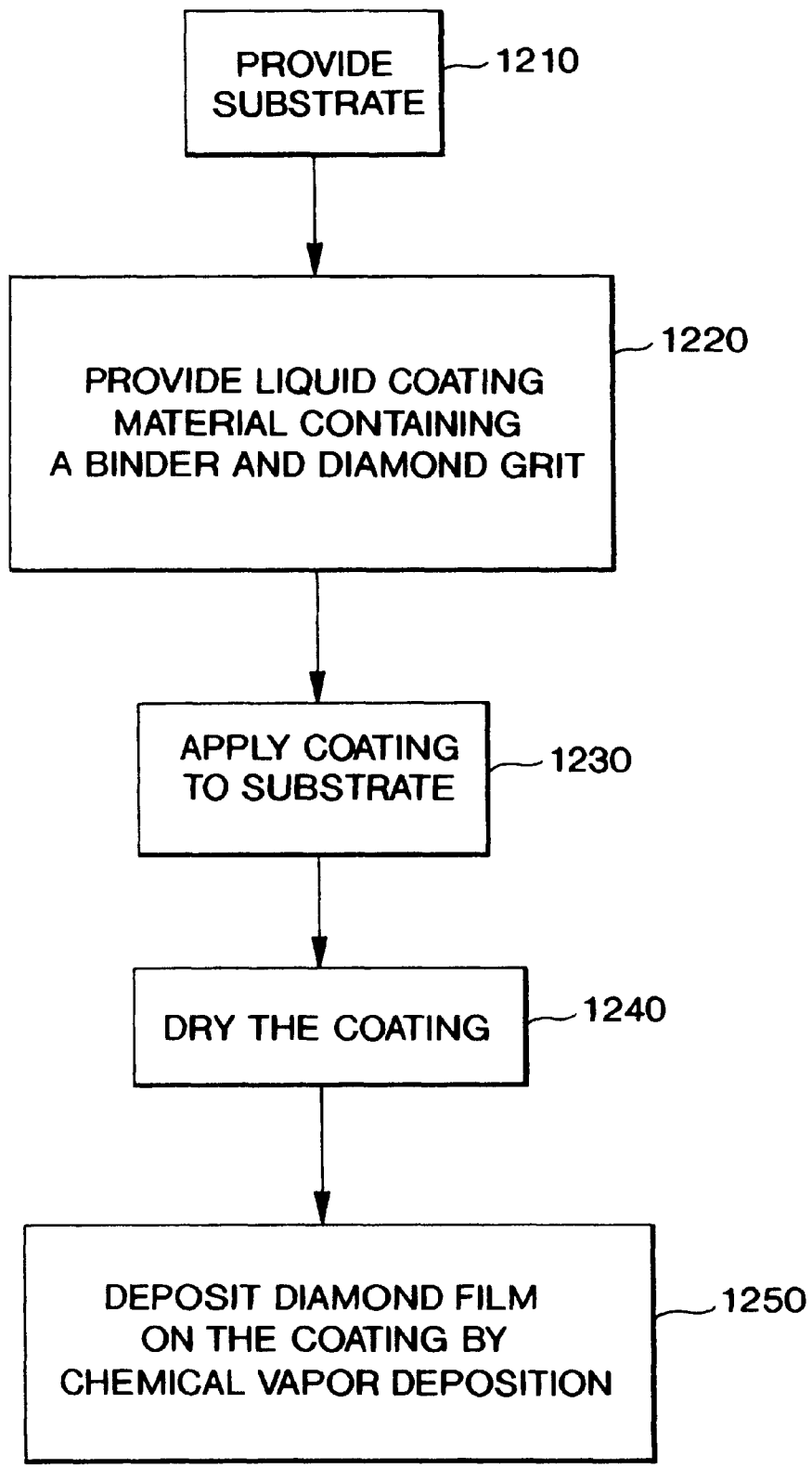
FIG. 2 is a flow diagram summarizing steps of a method in accordance with an embodiment of the invention.

Referring to FIG. 2, there is shown a flow diagram summarizing steps of a method in accordance with an embodiment of the invention. Further details of the method are subsequently set forth. The block 1210 represents providing of a substrate, the preferred substrate materials having a relatively low modulus of elasticity and matching reasonably well to diamond from the standpoint of coefficient of thermal expansion. The block 1210 can also represent the preparation of the surface of the substrate on which deposition is to be implemented. The block 1220 represents providing of a liquid coating containing a binder and diamond grit. [Diamond powders are well known for use in nucleation seeding, and also known as a thermally conductive interlayer. Reference can be made, for example, to U.S. Pat. Nos. 4,925,701, 4,987,002, 5,204,210, 5,298,286, and 5,330,802.] In a preferred embodiment hereof, the binder is a glass-forming oxide, and is initially in a liquid form as a colloid in water. The block 1230 represents applying the liquid coating to the substrate, and the block 1240 represents the step of drying the coating. The resultant layer, which is preferably surface finished for smoothness, comprises the glass-forming oxide binder and diamond grit. In embodiments hereof, most or substantially all of the dried coating can be binder and diamond grit (with a small amount of trapped water), but it will be understood that other substances can be present. The block 1250 represents deposition of a diamond film on the coated substrate by chemical vapor deposition ("CVD"), with plasma jet deposition being used in the illustrative preferred embodiments hereof. The diamond thickness is preferably at least 100 microns. Further details are provided next.

The presently preferred substrate material is graphite. The graphite material should have a relatively small pore size, for example a maximum pore size less than about 20 microns. Also, the graphite chosen should preferably have a coefficient of thermal expansion which substantially matches synthetic diamond. The graphite substrate can be machined or otherwise formed into a desired shape. In the present example this will be a flat disc, although it will be understood that other shapes and contours can be used. Polishing can be implemented, for example, by lapping, and the surface should preferably be polished smoother than the pore size. The polished substrate surface can then be cleaned using an ultrasonic cleaner. The graphite thickness should preferably be at least 10 percent of the square root of its area, to promote thermal conductance and reduce radial thermal gradients that can contribute to premature delamination or cracking.

In one embodiment hereof, the binder used is Duralco 250 Binder sold by Cotronics Company of Brooklyn, N.Y., which is a sodium hydroxide stabilized silicon dioxide colloidal solution in water. [Although colloids are presently preferred, it will be understood that the binder phase could also be formed by baking from suspensions or solutions of appropriate salts and or organometallic precursors.] The solution normally deposits a solid structure of silicon dioxide grains upon drying. The diamond grit has an average particle size in the range 0.1 to 10 microns and, more preferably, in the range 1 to 5 microns. Also in this embodiment, the ratio of binder to grit in the coating is preferably in the range 1:2 to 2:1, by weight. When coarser grits of the indicated range are used, the ratio of binder to grit by weight can be at the smaller end of the range. The mixture of binder and grit, in liquid form, can be applied to the prepared substrate by any suitable means, such as by spraying (which is preferred), or by pouring, painting, turntable technique, or electrostatic slurry application. The coating can be air dried at room temperature, and then oven dried, for example at 250° F. The coating surface can then be finished, such as by sanding and lap polishing and then blown with a nitrogen stream. The diamond film can then be deposited.

Equipment of the type illustrated in FIG. 1 has been used to produce diamond disks of diameters in the range 8 to 17 cm. In some examples, representative conditions for diamond deposition were approximately as follows:

| Deposition temperature | 900° C. |
|---|---|
| Pressure | 10 torr |
| Enthalpy | 70–80 kJ/g |
| % CH4 | 0.4% |

Coatings in accordance with the foregoing descriptions were employed, and diamond films having thicknesses in the approximate range 150 to 1000 microns were produced. Intact films which did not prematurely delaminate were obtained in the large majority of cases, and with improved efficiency as compared to techniques using other coated graphite and coated and uncoated metal substrates.

The above described embodiment used a binder of sodium hydroxide stabilized silicon dioxide colloidal solution in water. Instead of this binder, which is a basic stabilized aqueous colloidal solution, an improvement on the invention uses a binder that is an acid stabilized aqueous colloidal solution of silica and alumina, such as CAT-80 binder, sold by Akzo Nobel Company of Marietta, Ga. In other respects, the technique is similar to that described above. Again, the diamond grit has an average particle size preferably in the range 0.1 to 10 microns and, more preferably, in the range 1 to 5 microns. Again, the preferred ratio of binder to grit in the coating is in the range 1:2 to 2:1 by weight, and the coating can be applied by spraying, or other suitable technique, air dried at room temperature, and then oven dried, for example at 250° F. As before, the coating can then be suitably finished, whereupon the diamond film can be deposited.

As with the previously described coating (i.e., with a binder of sodium hydroxide stabilized silicon dioxide colloidal solution in water), the improved coating (with a binder of acid stabilized aqueous colloidal solution of silica and alumina) also forms relatively smaller grains that hold the relatively larger grains of diamond grit, and has the previously described advantages. However, the improved coating contains aluminum oxide (alumina) as well as silicon dioxide (silica). [Preferably, at least 10 percent by weight of the coating is silica and alumina, with the percent by weight of silica being greater than that of alumina, and with alumina accounting for at least 1 percent by weight of the coating.] The silica is believed to become encapsulated with alumina, but regardless of the actual structural relationship, the presence of both the silica and alumina in the coating has provided even greater operational advantage than just the silica of the previously described coating. The improved coating remains more stable at higher temperature due to the presence of the alumina in combination with the silica. Applicant has found that the improved coating permits higher temperature diamond film deposition and deposition of thicker diamond films, with further reduction in occurrence of delamination and/or cracking of the deposited diamond film.

Equipment of the type illustrated in FIG. 1 has also been used to produce diamond disks using the improved coating. In some examples, conditions for diamond deposition were approximately the same as those first listed above, except that the deposition temperature was 980° C. [The higher deposition temperature was not employed as successfully with the previously described coating, and resulted in more frequent cracking and/or premature delamination of the diamond film during deposition.] More specifically, for these examples representative conditions for diamond deposition were approximately as follows:

| Deposition temperature | 980° C. |
|---|---|
| Pressure | 10 torr |
| Enthalpy | 70–80 kJ/g |
| % CH4 | 0.4% |

The ability to use a higher deposition temperature has the advantage of producing diamond film with improved properties, especially improved mechanical strength. The improved coating permitted deposition of thick films of the order of 1000 microns, and intact films which did not prematurely delaminate were obtained in the large majority of cases, again with improved efficiency as compared to prior techniques using other coated graphite and coated and uncoated metal substrates.

What is claimed is:

1. For use in chemical vapor deposition of a diamond film wherein a hydrocarbon gas and atomic hydrogen are utilized in depositing the diamond film on a deposition target medium, a deposition target medium, comprising:

a substrate having a Young's modulus of less than 50 GPa;

a coating on said substrate, said coating comprising a binder and diamond grit, said binder comprising a glass-forming oxide.

2. The deposition target medium as defined by claim 1, wherein said substrate is formed of a substance selected from the group consisting of graphite and hexagonal boron nitride.

3. The deposition medium as defined by claim 1, wherein said substrate is a graphite substrate.

4. The deposition target medium as defined by claim 3, wherein said glass-forming oxide comprises silicon dioxide.

5. The deposition target medium as defined by claim 3, wherein said glass-forming oxide comprises silicon dioxide and aluminum oxide.

6. The deposition target medium as defined by claim 3, wherein at least 10 percent by weight of said coating is diamond grit, and at least 10 percent by weight of said coating is said glass-forming oxide.

7. The deposition target medium as defined by claim 4, wherein at least 10 percent by weight of said coating is diamond grit, and at least 10 percent by weight of said coating is silicon dioxide.

8. The deposition target medium as defined by claim 5 wherein at least 10 percent by weight of said coating is diamond grit and at least 10 percent by weight of said coating is the combination of silicon dioxide and aluminum oxide.

9. The deposition target medium as defined by claim 8, wherein the percent by weight of silicon dioxide is greater than the percent by weight of aluminum oxide, and wherein at least 1 percent by weight of said coating is aluminum oxide.

10. The deposition target medium as defined by claim 7, wherein said diamond grit has an average particle size in the range of 0.1 to 10 microns.

11. The deposition target medium as defined by claim 9, wherein said diamond grit has an average particle size in the range of 0.1 to 10 microns.

12. The deposition target medium as defined by claim 7, wherein said diamond grit has an average particle size in the range of 1 to 5 microns.

13. The deposition target medium as defined by claim 9, wherein said diamond grit has an average particle size in the range of 1 to 5 microns.

14. The deposition target medium as defined by claim 9, wherein the ratio of binder to grit in said coating is in the range of 1:2 to 2:1, by weight.

15. The deposition target medium as defined by claim 14, wherein the thickness of said coating is in the range of 10 microns to 200 microns.

16. The deposition target medium as defined by claim 14, wherein the thickness of said coating is in the range of 20 to 100 microns.

* * * * *